US006393088B1

(12) United States Patent
Emineth et al.

(10) Patent No.: US 6,393,088 B1
(45) Date of Patent: May 21, 2002

(54) MEASUREMENT SYSTEM WITH A FREQUENCY-DIVIDING EDGE COUNTER

(75) Inventors: Mark J. Emineth, Washington, DC (US); Steve McCoy, Eden Prairie, MN (US); Jan Wilstrup, Mounds View, MN (US); Chris Kimsal, Chanhassen, MN (US)

(73) Assignee: Wavecrest Corporation, Eden Prairie, MN (US)

( * ) Notice: Subject to any disclaimer, the term of this patent is extended or adjusted under 35 U.S.C. 154(b) by 0 days.

(21) Appl. No.: 09/761,560

(22) Filed: Jan. 16, 2001

(51) Int. Cl.[7] ................................................ H03K 21/00
(52) U.S. Cl. .............................. 377/20; 377/44; 377/47

(58) Field of Search ............................... 377/20, 44, 47

(56) References Cited

U.S. PATENT DOCUMENTS 5,166,959 A * 11/1992 Chu et al. ...................... 377/20

* cited by examiner

*Primary Examiner*—Margaret R. Wambach
(74) *Attorney, Agent, or Firm*—Merchant & Gould P.C.

(57) ABSTRACT

An event counter circuit including an input signal coupled to a frequency divider circuit that can be cleared by an external signal, a multiplexer coupled to the divider circuit driven by an output edge and its inverse, and a counter circuit coupled to the multiplexer driven by outputs of the multiplexer.

15 Claims, 8 Drawing Sheets

MEASUREMENT SYSTEM WITH A FREQUENCY-DIVIDING EDGE COUNTER

TECHNICAL FIELD

This invention relates in general to measurement apparatus; more particularly, to a time measurement system for analyzing components of a signal.

BACKGROUND OF THE INVENTION

A measurement apparatus is disclosed in U.S. Pat. No. 4,908,784, which is hereby incorporated by reference. A typical measurement apparatus is the Wavecrest DTS-2075, available from Wavecrest Corporation, Edina, Minn. A measurement apparatus measures the time interval between two edge transitions through counters. Known measurement apparatus such as the Wavecrest DTS-2075 have two dedicated synchronous counters that take in every edge of signal under test in order to identify the edges to be measured. For each run of the measurement apparatus, only a "start" edge and a "stop" edge may be measured. Identifying and accurately measuring the time of a particular edge becomes more difficult as input frequencies increase.

One solution, used in the DTS-2075, is to re-clock the terminal count output of the synchronous counters with a delayed version of the input signal. This method requires that the counters run at the input frequency and that the wideband input signal be delayed without significant distortion. These two requirements become difficult to meet for high frequency inputs. If this method is extended to allow the measurement of many edges, it requires the high speed signal to be split to many counters, which results in either lower signal amplitudes which result in higher measurement jitter, or the use of wideband amplifier stages that are difficult to implement without either great expense or some signal distortion which results in time measurement errors.

There is a need for a simplified measurement apparatus that is capable of high frequency operation with low error. There is a also a need for a measurement apparatus that is capable of measuring many edges of a high frequency signal during one test run.

SUMMARY OF THE INVENTION

In accordance with the present invention, the above and other problems are solved by a system that allows time measurement of the Nth edge after arming while minimizing the signal integrity problems associated with propagating high-frequency signals. The system includes a frequency divider circuit that can be cleared by an external signal, a multiplexer coupled to the divider circuit driven by an output edge its inverse, and a counter circuit coupled to the multiplexer driven by outputs of the multiplexer. A time quantizer may be coupled to the counter outputs.

The system according to this invention allows a higher frequency of operation by reducing the output frequency of the parts. It reduces the number of high-frequency components, which may allow a cost savings by allowing the use of lower-speed parts and which may allow the circuit to be integrated more cost-effectively. It generates multiple outputs to allow time measurements of multiple edges in a data stream or clock signal. It has multiple time stamping modules (time quantizers) that can be assigned to measure the times of arbitrary edges on any input.

In one embodiment, ripple counters rather than synchronous counters implement the 'Arm on Nth event' counters. Higher input frequencies are allowed by using the counter stages as frequency dividers, thereby avoiding the need to propagate highfrequency signals through the arming circuit and providing a scalable method for increasing operating frequencies in the future. The ripple counter will essentially 'swallow' the first N-1 edges after the arming signal, and output its terminal count signal on the Nth edge. The synchronous terminal count signal is then used to trigger the ramps.

In another embodiment, the high-frequency input is split into parallel, lower frequency signals using a cascade of frequency dividers. Choosing the appropriate lower frequency signal path corresponds to choosing a certain preset value of a ripple counter. This embodiment allows the frequency-divided signals to be split to drive many timers, avoiding many of the signal integrity problems associated with splitting the high-frequency input signal many ways.

In accordance with other aspects, the present invention relates to a time measurement apparatus including an event counter circuit and time quantizers. The event counter circuit includes a frequency divider circuit that can be cleared by an external signal, a multiplexer coupled to the divider circuit driven by an output edge and its inverse, and a counter circuit coupled to the multiplexer driven by outputs of the multiplexer.

The great utility of the invention is that measurement apparatus provides for increased measurement rates and input frequencies and measurements of multiple edges in data streams to give more detailed timing information.

These and various other features as well as advantages, which characterize the present invention, will be apparent from a reading of the following detailed description and a review of the associated drawings.

DETAILED DESCRIPTION OF THE INVENTION

Figure 1:
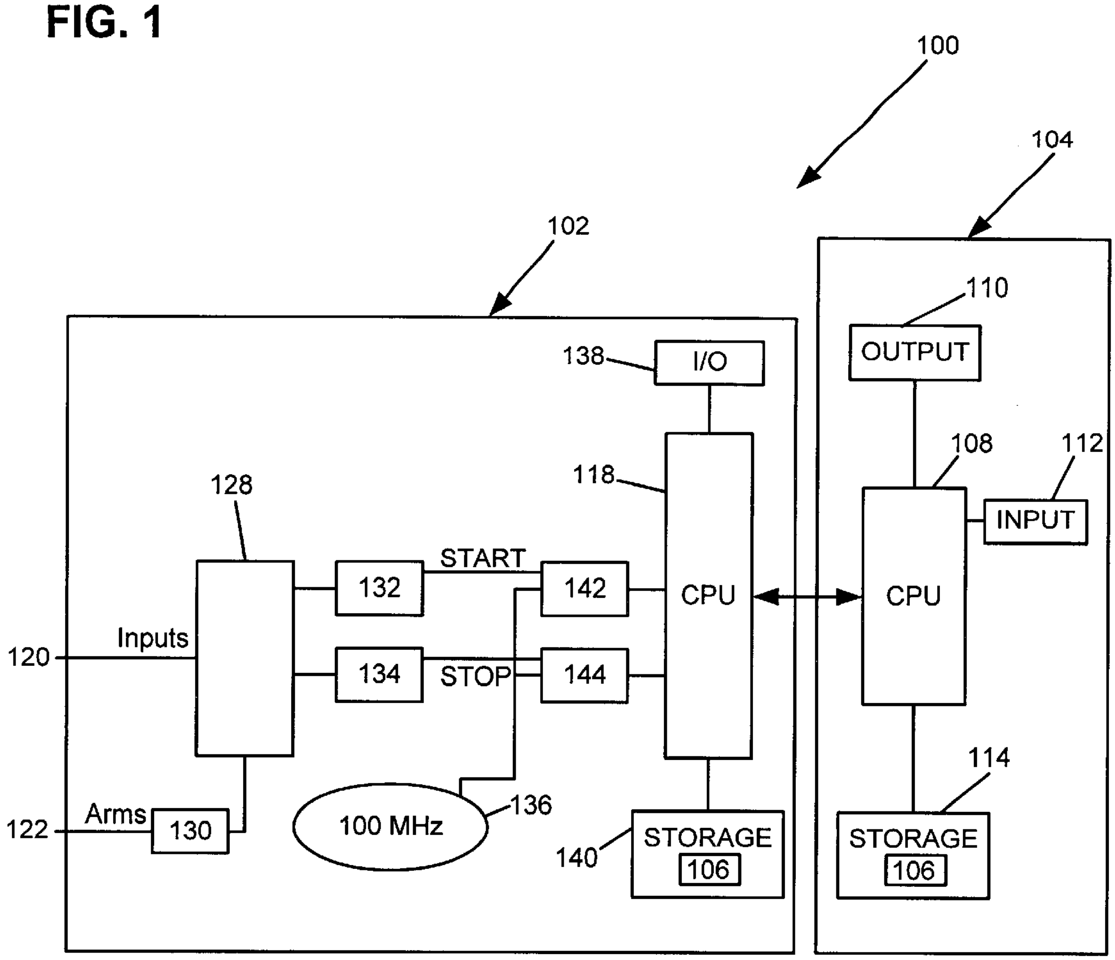
FIG. 1 illustrates a signal analyzing system according an embodiment of the present invention.

FIG. 1 illustrates a signal analyzing system 100 according an embodiment of the present invention. A typical configuration may include a measurement apparatus 102 that measures the time interval between two events (start and stop) through counters and interpolating voltage ramps.

A measurement apparatus 102 is disclosed in U.S. Pat. No. 4,908,784, which is hereby incorporated by reference. A typical measurement apparatus is the Wavecrest DTS-2075, available from Wavecrest Corporation, Edina, Minn.

The measurement apparatus 102 interfaces to a workstation 104 and operates under the control of an analysis program 106 resident on the workstation 104. The analysis program 106 is typically implemented through data analysis software. One commercially available analysis software is the Wavecrest Virtual Instrument (VI) software, available from Wavecrest Corporation, Edina, Minn. The workstation 104 comprises a processor 108 and a memory including random access memory (RAM), read only memory (ROM), and/or other components. The workstation 104 operates under control of an operating system, such as the UNIX® or the Microsoft® Windows NT/2000 operating system, stored in the memory to present data to the user on the output device 110 and to accept and process commands from the user via input device 112, such as a keyboard or mouse.

The analysis program 106 is preferably implemented using one or more computer programs or applications executed by the workstation 104. Those skilled in the art will recognize that the functionality of the workstation 104 may be implemented in alternate hardware arrangements, including a configuration where the measurement apparatus 102 includes CPU 118, memory 140, and I/O 138 capable of implementing some or all of the steps performed by the analysis program 106. Generally, the operating system and the computer programs implementing the present invention are tangibly embodied in a computer-readable medium, e.g. one or more data storage devices 114, such as a ZIP® drive, floppy disc drive, hard drive, CD-ROM drive, firmware, or tape drive. However, such programs may also reside on a remote server, personal computer, or other computer device.

The analysis program 106 provides for measurement/analysis options and measurement sequences. The analysis program 106 interacts with the measurement apparatus 102 through the on-board CPU 118. In one embodiment, the measurement apparatus 102 provides arming/enabling functionality such that the apparatus 102 can measure a signal either synchronously or asynchronously. The signal is fed to the input signal 120 and may be fed to the arming signal 122. The arming signal 122 may be provided to an arming subsystem 130. The input signal 120 is provided to a high frequency divider circuit 128. The divider circuit 128 generates an output that is lower in frequency than the inputs. A one-shot measurement is taken from the Mth data edge after the arming signal to the Nth edge after the arming signal. M and N are integers. The outputs of the divider circuit 128 are provided to lower frequency dividers 132 and 134. Dividers 132 and 134 provide a start and stop signal to time quantizers 142 and 144, respectively. Time quantizers 142 and 144 provide a time stamp using clock 136 as a reference. Clock 136 is typically a precise crystal oscillator. The time quantizers 142 and 144 allow the time interval between the start and stop events to be measured by comparison of the time stamps generated by each event.

Figure 2:
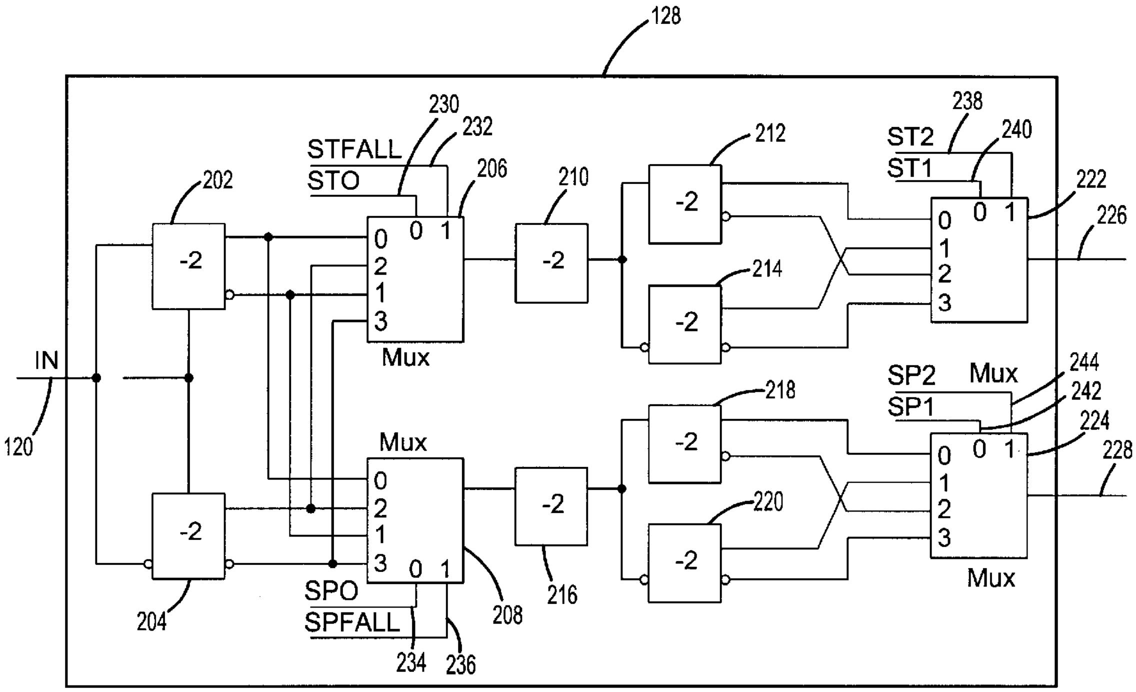
FIG. 2 illustrates an embodiment of the high frequency divider circuit according to the present invention.

FIG. 2 illustrates an embodiment of the divider circuit 128 according to the present invention. The input signal 120 is split so that its rising edges trigger one frequency divider 202 and its falling edges trigger another frequency divider 204. The outputs of these frequency dividers 202 and 204 are split to the START and STOP paths, and multiplexers 206 and 208 allow the selection of edges based on the setting of the least significant bit of the Arm on Nth event counter, as illustrated by dividers 128 and 132 in this embodiment, and on the edge required at the input. If the input frequency dividers 202 and 204 will operate at up to 2.8 GHz, the multiplexers 206 and 208 will run at up to 1.4 GHz. After the multiplexers 206 and 208 there is a cascade of two more frequency dividers 210, 212, 214, 216, 218, and 220 and multiplexers 222 and 224 to choose the proper edge based on the bits of the Arm on Nth event counter. The output signal of the multiplexers 222 and 224 are provided as signal 226 and signal 228, respectively. In the embodiment illustrated in FIG. 2, a 2.8 GHz input corresponds to a 350 MHz signal at this stage. Signals 230–244 select the appropriate inputs to multiplexers 206, 208, 222, and 224.

Figure 3:
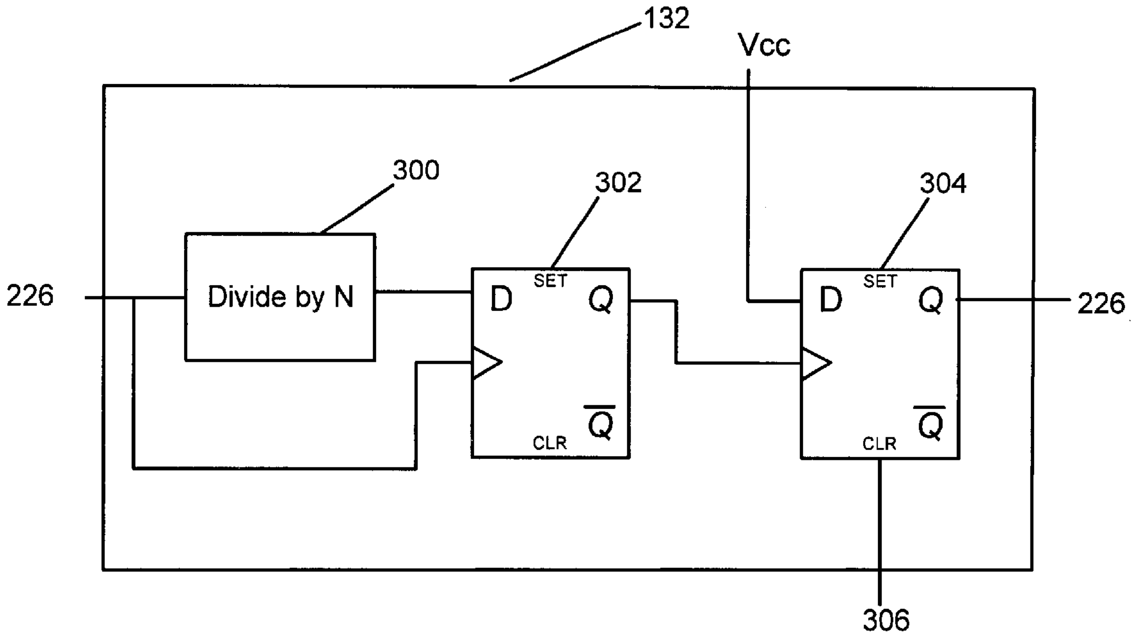
FIG. 3 illustrates an embodiment of a lower frequency divider circuit according to the present invention.

FIG. 3 illustrates an embodiment of a lower frequency divider 132 of an arm on Nth event counter. Flip-flop 302 re-clocks the terminal count output of the synchronous 16-bit counter 300 to minimize timing error. Flip-flop 304 generates a rising edge on the start signal that is triggered by the event to be measured. Clear signal 306 resets the flip-flop 304. Lower frequency divider 134 (not shown) has a similar configuration to divider 132 but is arranged to time the stop signal.

Figure 4:
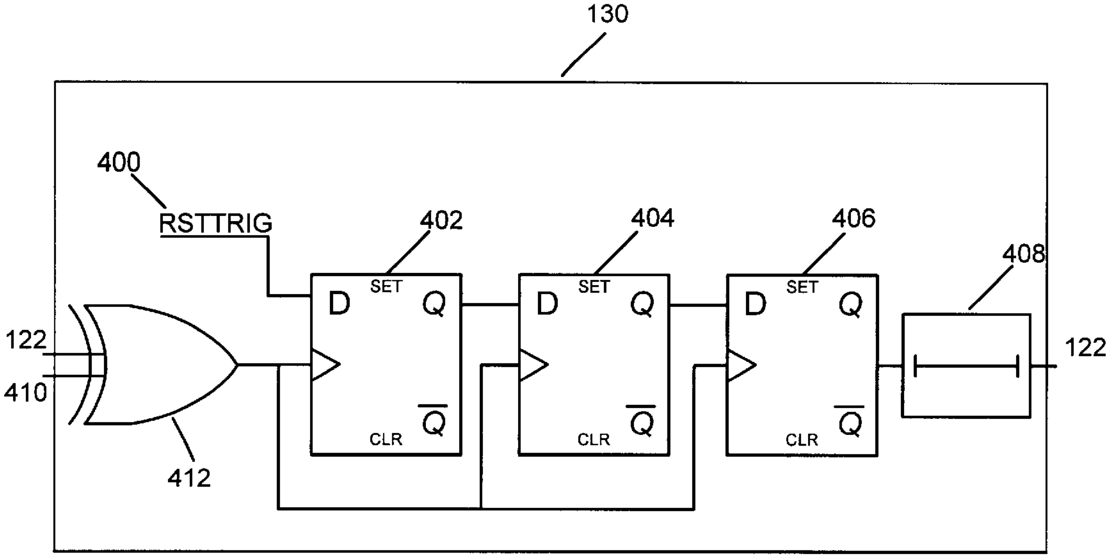
FIG. 4 illustrates an embodiment of the arming subsystem circuit according to the present invention.

FIG. 4 illustrates the arming subsystem 130 according to an embodiment of the present invention. The input signal 122 and an arm invert signal 410 are provided to a XOR gate 412. After the rising or falling edge is selected, the internal RSTTRIG signal 400 is synchronized with the input by a cascade of three flip-flops 402, 404, and 406 to avoid problems with metastability, even at higher rates. The synchronized signal may be sent through a programmable delay 408 to produce the arming signal 122. The delayed, synchronized signal 122 is then distributed to enable the counter stages and clear the appropriate flip-flops at the appropriate times.

Figure 5:
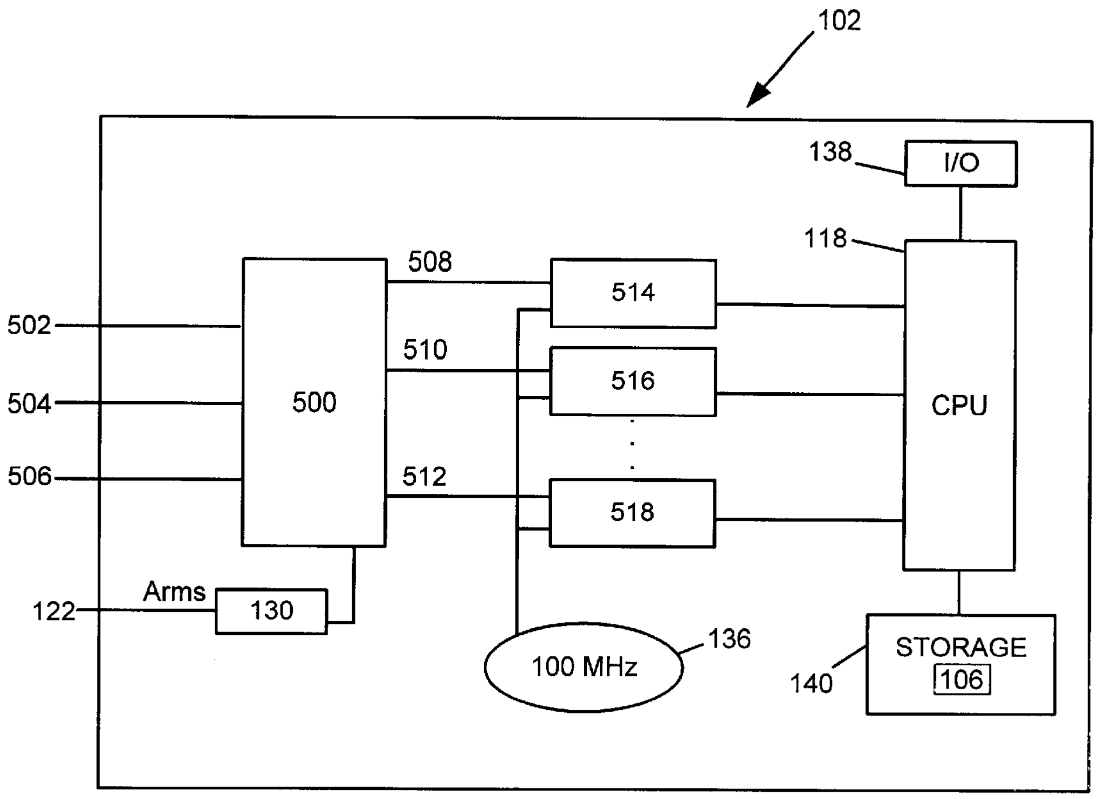
FIG. 5 illustrates a measurement apparatus according to another embodiment of the present invention.

FIG. 5 illustrates a measurement apparatus 102 according to another embodiment of the present invention. Input signals 502, 504, and 506 are provided to an array of Arm on Nth event counters 500. The event counters 500 provide signals 508, 510, and 512 to time quantizers 514, 516, and 518, respectively. Time quantizers 514, 516, and 518provide a time stamp using clock 136 as a reference.

Figure 6:
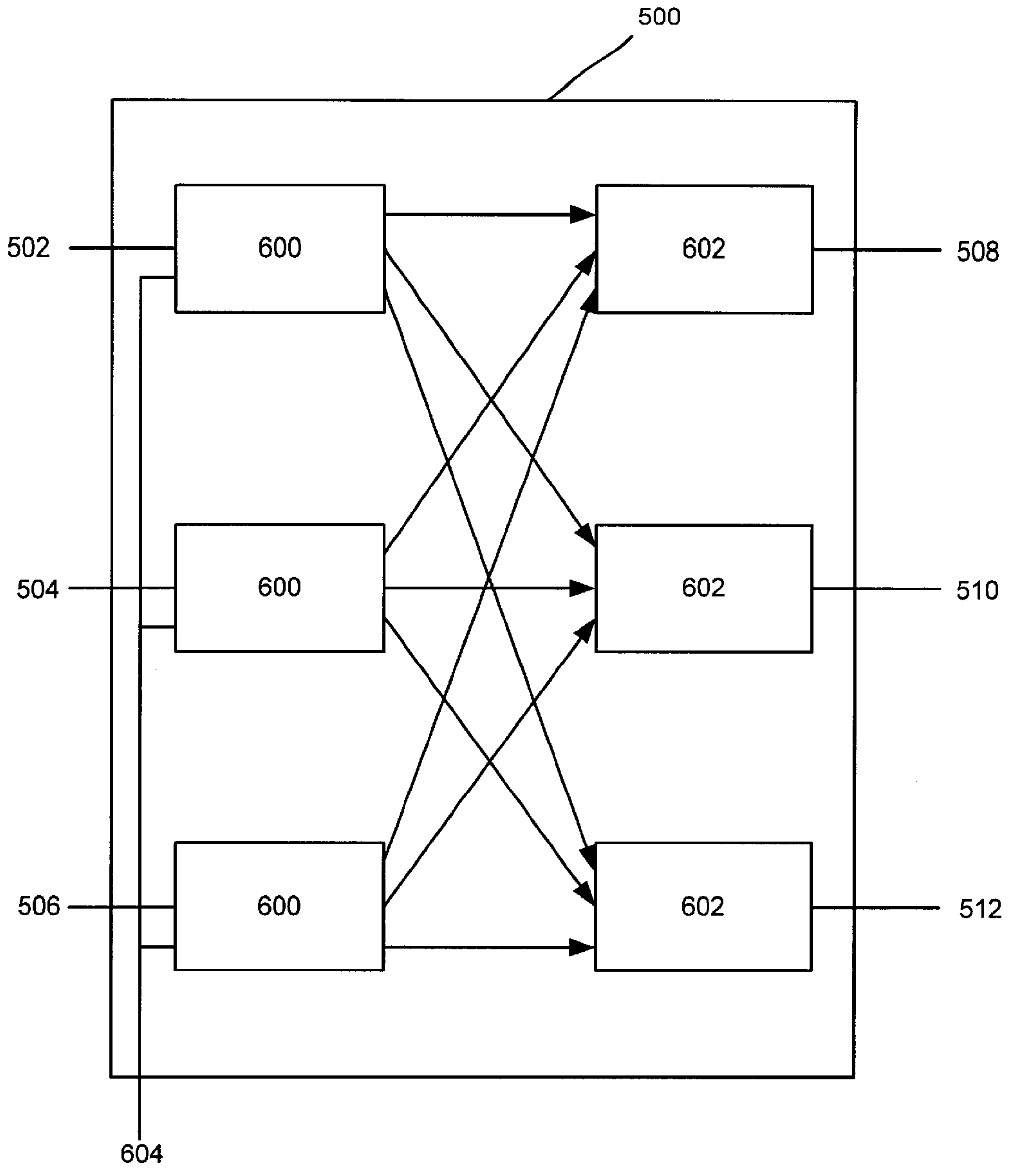
FIG. 6 illustrates an array of event counters according to one embodiment of the present invention.

FIG. 6 illustrates an array of event counters 500 according to one embodiment of the present invention. Start signals 502, 504, and 506 are provided to high frequency divider circuits 600 which provide start and stop signals to each of the lower frequency divider circuits 602. Divider circuits 602 provide signals 508, 510, and 512. Count enable signal 604 is provided to the divider circuits 600. The modular design of event counter 500 enables it to accommodate many input signals and generate many independent outputs to drive multiple time quantzers. In the embodiment of FIG. 6 three inputs and outputs are shown. Those skilled in the art will recognize that other arrangements are possible.

Figure 7:
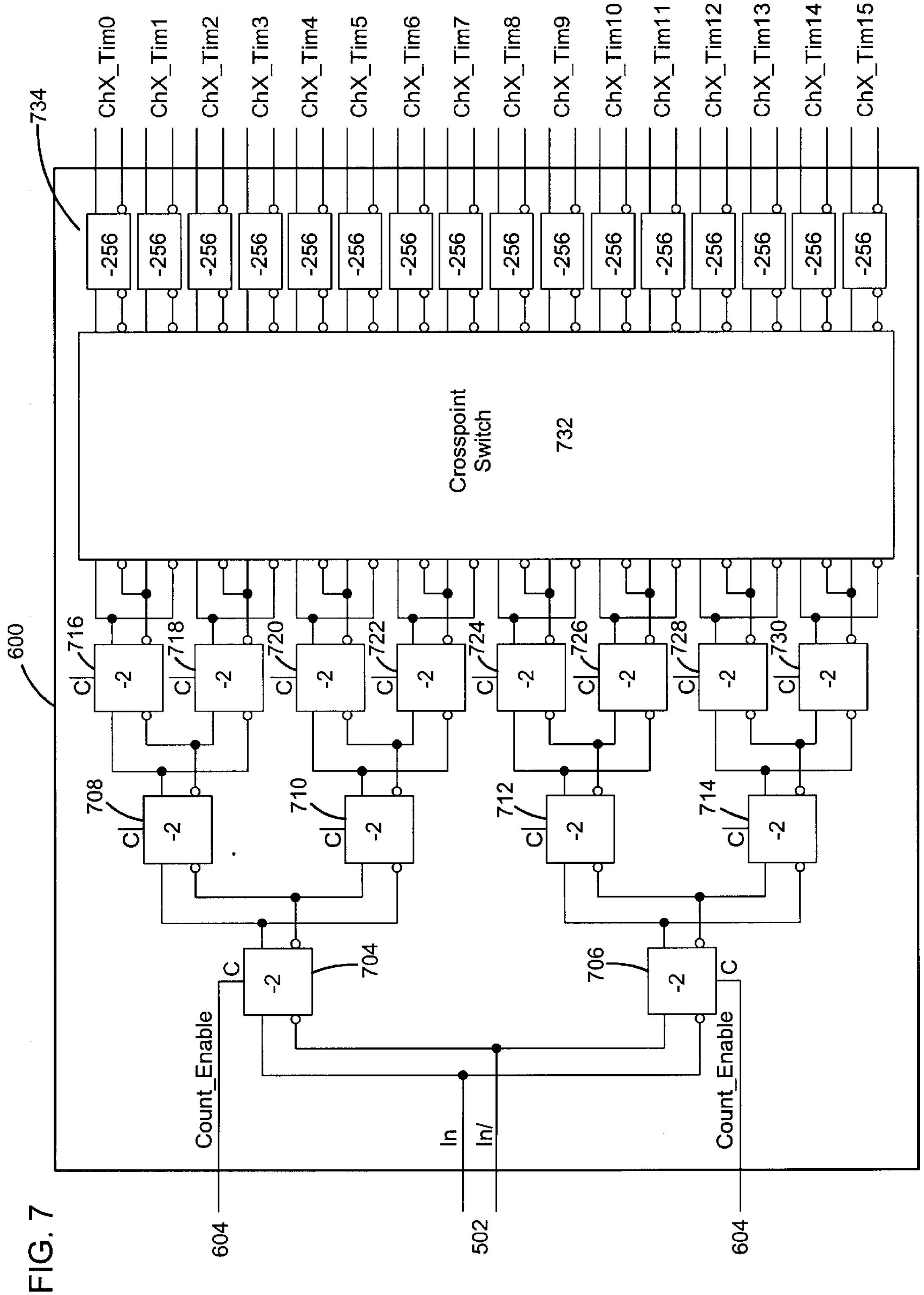
FIG. 7 illustrates an exemplary high frequency divider circuit according to an embodiment of the present invention.

FIG. 7 illustrates an exemplary high frequency divider circuit 600 according to an embodiment of the present invention. A frequency divider tree is shown using readily available components. Input 502 is typical of an input to a typical high frequency divider circuit 600. Each input 502 is fed into a pair of frequency dividers 704 and 706 that have the ability to be held in a cleared state by a count enable signal 604. An exemplary frequency divider 704 and 706 is the Motorola EL32. Divider 704 is triggered by the rising edge of the input 502 and divider 706 is triggered by the falling edge of the input 502. The outputs of each of these frequency dividers 704 and 706 are fed into another, similar pair of frequency dividers 708, 710, 712, and 714. Each of the frequency dividers 708, 710, 712, and 714 is fed into a similar pair of frequency dividers 716, 718, 720, 722, 724, 726, 728, and 730. This frequency divider 'tree' is continued until the divider outputs are at a low enough frequency to reliably clock the low-speed counter circuitry used to implement the rest of the counters when the inputs are driven at the maximum required input frequency. The counters will typically be large; having a range of several million cycles, and the frequency dividers 704–730 will typically be able to operate at a higher frequency and with more stable delays than large, complex counters. The clear pins of the frequency dividers 704–730 are connected and cleared by a count enable signal 604.

When the count enable signal 604 is not asserted and the dividers 704–730 are free-running, the outputs of the frequency divider 'tree' will each generate a rising edge every $2^m$ edges of the input signal 502 (where 'm' is the number of frequency dividers the signals have passed through). In the embodiment of FIG. 7, m=3. Doubling the number of outputs of the divider 'tree' by adding the ability to look at an inverted version of each output will generate $2^{(m+1)}$ outputs, each of which will have a rising edge caused by a different edge (rising or falling) at the input. Each output will therefore 'swallow' a different number of input edges after the removal of the count enable signal 604 before generating a rising edge. The high frequency divider circuit 600 can count edges (modulo $2^m$) after the arming event by selecting an appropriate branch of the frequency divider tree. In other embodiments, the frequency divider tree may be implemented with parallel ripple counters.

In the embodiment of FIG. 7, a non-blocking crosspoint switch 732 is added after the frequency divider tree. This allows several time quantizers to be driven using unique counter values during the measurement cycle. An exemplary crosspoint switch 732 is a S2016 manufactured by AMCC. Each branch of the tree drives a crosspoint switch 732 input, and each output of the crosspoint switch 732 is followed by a p bit counter 734 configured as a frequency divider that can be preset to absorb an arbitrary number of edges before its first output rising edge. In the embodiment of FIG. 7, p=8 and counter 734 is an 8 bit counter MC10E016 manufactured by Motorola.

Figure 8:
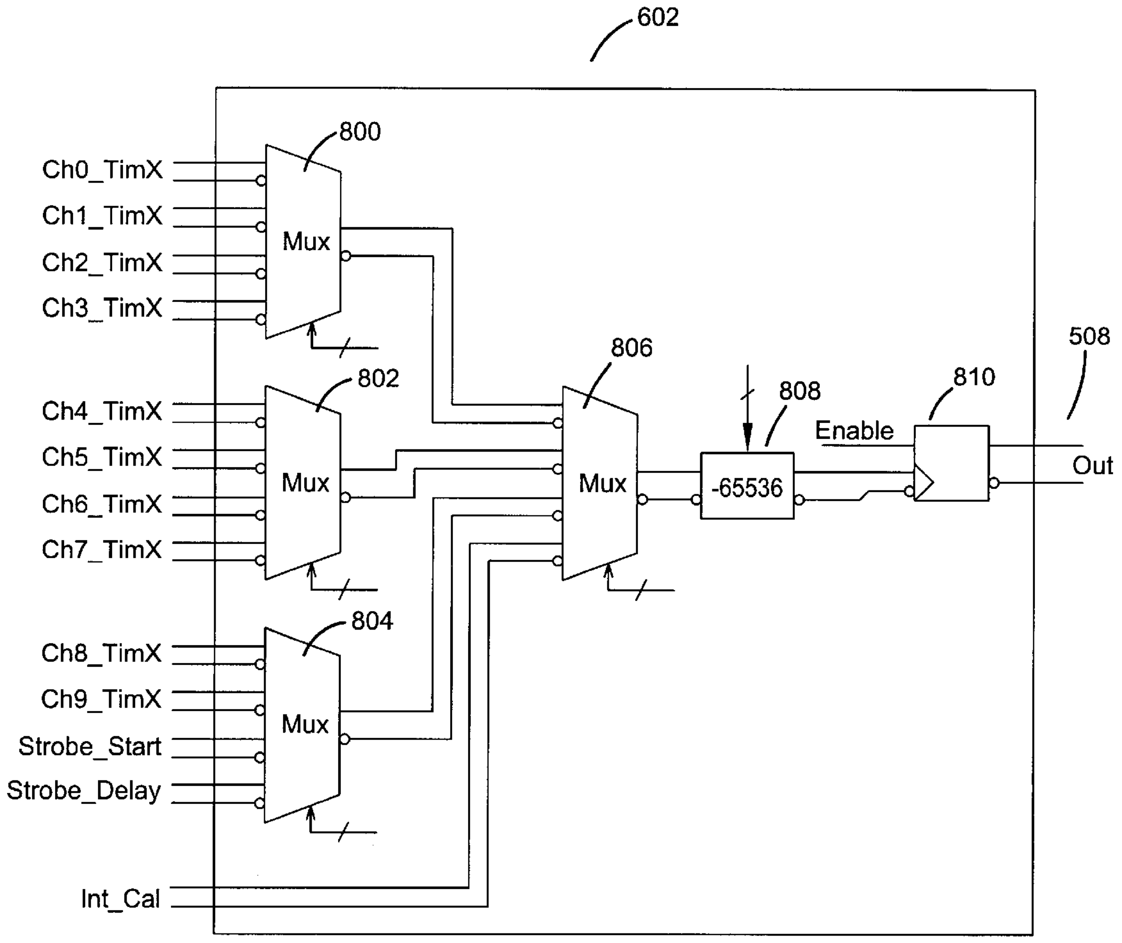
FIG. 8 illustrates an exemplary lower frequency divider circuit according to an embodiment of the present invention.

FIG. 8 illustrates an exemplary lower frequency divider circuit 602 according to an embodiment of the present invention. The outputs of the counters 734 are provided to multiplexers 800, 802, 804, and 806. An exemplary multiplexer 800, 802, 804, and 806 is the Motorola MC10HEL52. The first rising edge out of the high frequency divider circuit 600 can trigger the time measurement, or the outputs high speed divider circuit 600 can be used to drive another level of $2^q$ bit frequency dividers 808 to extend the range of the event counters (q=16 in FIG. 8). In this embodiment, splitting the event counters is a compromise solution to limit the total number of parts in the system while still allowing the input frequency to be divided to a low enough rate to make the signal routing problem more practicable. Flip-flop 810 generates a rising edge on the output signal 508 that is triggered by the event to be measured. Signal 508 E provided to the time quantizer 514. In another embodiment, the counters 734 may be replaced by p+q bit counters and the frequency divider 808 can be eliminated. Other arrangements of the counters are possible.

Each input 502, 504, and 506 therefore has the ability to drive multiple time quantizers 514, 516, and 518, each one triggered by a different edge after the arming event (up to $2^{(m+p+q)}$edges). Each time quantizer 514, 516, and 518 has the ability to select any of a number of inputs as its source. This allows flexibility for making different kinds of measurements. For example, if data stream characterization measurements are being made, all of the time quantizers 514, 516, and 518 available can make measurements on the same input signal, and do so at a combined rate that is faster than a single time quantizer could manage. If delay measurements are being made between multiple inputs, the time quantizers 514, 516, and 518 can be assigned appropriately to make multiple measurements, perhaps for an entire data bus relative to a clock. Increased time measurement resolution could be obtained by assigning multiple time quantizers 514, 516, and 518 to measure the same event and averaging their results.

The embodiments described herein are based on several tradeoffs due to standard part availability, system power consumption, size, and cost. Those skilled in the art will recognize that other arrangements are possible. The system can be separated into modules in different places (or not at all). The generality of the event counter outputs can also be modified by forcing some or all of event counters to generate an output a fixed number of edges after either the arm or after the generation of a master, programmable output.

While the invention has been particularly shown and described with reference to preferred embodiments thereof, it will be understood by those skilled in the art that various other changes in the form and details may be made therein without departing form the spirit and scope of the invention.

What is claimed is:

1. An event counter circuit, comprising:

an input signal coupled to a frequency divider circuit that can be cleared by an external signal;

a multiplexer coupled to the divider circuit driven by an output edge and its inverse; and a counter circuit coupled to the multiplexer driven by outputs of the multiplexer.

2. The circuit of claim 1, further comprising a time quantizer coupled to the counter circuit.

3. The circuit of claim 1, wherein the divider circuit has a first divider and a second divider, wherein the first divider is triggered by a rising edge of the input signal and the second divider is triggered by a falling edge of the input signal.

4. The circuit of claim 1, wherein the frequency divider circuit comprises a first divider, an output of the first divider is coupled to a second divider and an inverted output of the first divider is coupled to a third divider, wherein the second divider is triggered by falling edges and the third divider is triggered by rising edges.

5. The circuit of claim 3, wherein an output of the first divider is coupled to a second divider and an inverted output of the first divider is coupled to a third divider, wherein the second divider is triggered by falling edges and the third divider is triggered by rising edges.

6. The circuit of claim 1, wherein the multiplexer is a crosspoint switch, further comprising a plurality of frequency divider circuits coupled to the crosspoint switch to produce a plurality of independent outputs.

7. The circuit of claim 6, further comprising a time quantizer coupled to the counter circuit.

8. The event counter circuit according to claim 1, further comprising:

a second event counter circuit according to claim 1;

a input selection multiplexer coupled to the event counter circuit and the second event counter circuit; and a time quantizer coupled to the input selection multiplexer.

9. A time measurement apparatus, comprising:

an event counter circuit comprising a frequency divider circuit that can be cleared by an external signal, a multiplexer coupled to the divider circuit driven by an output edge and its inverse, and a counter circuit coupled to the multiplexer driven by outputs of the multiplexer; and a time quantizer circuit coupled to the event counter circuit.

10. The apparatus of claim 8, wherein the divider circuit has a first divider and a second divider, wherein the first divider is triggered by a rising edge of the input signal and the second divider is triggered by a falling edge of the input signal.

11. The apparatus of claim 9, wherein the frequency divider circuit comprises a first divider, an output of the first divider is coupled to a second divider and an inverted output of the first divider is coupled to a third divider, wherein the second divider is triggered by falling edges and the third divider is triggered by rising edges.

12. The apparatus of claim 10, wherein an output of the first divider is coupled to a second divider and an inverted output of the first divider is coupled to a third divider, wherein the second divider is triggered by falling edges and the third divider is triggered by rising edges.

13. The apparatus of claim 8, wherein the multiplexer is a crosspoint switch, further comprising a plurality of frequency divider circuits coupled to the crosspoint switch to produce a plurality of independent outputs.

14. The apparatus of claim 13, further comprising a time quantizer coupled to the counter circuit.

15. The apparatus of claim 9, further comprising:

a second event counter circuit comprising a frequency divider circuit that can be cleared by an external signal, a multiplexer coupled to the divider circuit driven by an output edge and its inverse, and a counter circuit coupled to the multiplexer driven by outputs of the multiplexer;

a input selection multiplexer coupled to the event counter circuit and the second event counter circuit; and a time quantizer coupled to the input selection multiplexer.

* * * * *